US010695914B2

(12) United States Patent
Schiepp et al.

(10) Patent No.: US 10,695,914 B2
(45) Date of Patent: Jun. 30, 2020

(54) GRIPPER DEVICE, AND USE OF A GRIPPER DEVICE

(71) Applicant: ETO Magnetic GmbH, Stockach (DE)

(72) Inventors: Thomas Schiepp, Seitingen-Oberflacht (DE); Markus Laufenberg, Stockach (DE); Markus Raab, Leutershausen (DE); Bernhard Ernst, Windsbach (DE)

(73) Assignee: ETO Magnetic GmbH, Stockach (DE)

( * ) Notice: Subject to any disclaimer, the term of this patent is extended or adjusted under 35 U.S.C. 154(b) by 372 days.

(21) Appl. No.: 15/501,043

(22) PCT Filed: Jul. 6, 2015

(86) PCT No.: PCT/EP2015/065330
§ 371 (c)(1),
(2) Date: Feb. 1, 2017

(87) PCT Pub. No.: WO2016/015953
PCT Pub. Date: Feb. 4, 2016

(65) Prior Publication Data
US 2017/0225338 A1    Aug. 10, 2017

(30) Foreign Application Priority Data
Aug. 1, 2014    (DE) ............ 10 2014 110 954

(51) Int. Cl.
*B25J 15/02*    (2006.01)
*B25J 9/10*    (2006.01)
(Continued)

(52) U.S. Cl.
CPC ......... *B25J 15/0246* (2013.01); *B25J 9/1085* (2013.01); *F03G 7/065* (2013.01); *H01L 41/12* (2013.01)

(58) Field of Classification Search
CPC ................ B25J 9/1085; B25J 15/0264
See application file for complete search history.

(56) References Cited

U.S. PATENT DOCUMENTS

| 6,720,402 | B2 * | 4/2004 | Langer ............... | B29C 61/003 |
| | | | | 525/415 |
| 2014/0012101 | A1 * | 1/2014 | Tammam ............. | A61B 5/6882 |
| | | | | 600/309 |

FOREIGN PATENT DOCUMENTS

| CN | 202066873 U | 12/2011 |
| CN | 103350423 A | 10/2013 |

(Continued)

OTHER PUBLICATIONS

International search report for application No. PCT/EP2015/065330 dated Oct. 29, 2015.

(Continued)

*Primary Examiner* — Ronald P Jarrett
(74) *Attorney, Agent, or Firm* — Bachman and Lapointe PC; George Coury

(57) ABSTRACT

A gripper device (16; 30; 56; 90; 120) which is designed so as to be movable along a movement path, and which serves for grasping and holding a workpiece (70) and for moving the workpiece along the movement path, with at least one first contact section (18; 38; 66) which, to produce an operative pairing with the workpiece that effects the gripping or holding action, can be driven relative to a second contact section (20; 40; 68), which first contact section is assigned actuator means (22; 44; 54; 128), which are designed to exert a drive force in reaction to the application of a magnetic field, and which are composed of a magnetic shape-memory alloy material, wherein the actuator means for magnetic interaction are formed, for the application of a magnetic field, with magnetic field generating means that are static at one position of the movement path (52; 80; 86;

(Continued)

88), and/or with magnetic field generating means that are provided so as to be movable independently of the gripper device.

14 Claims, 3 Drawing Sheets

(51) Int. Cl.
*F03G 7/06* (2006.01)
*H01L 41/12* (2006.01)

(56) References Cited

FOREIGN PATENT DOCUMENTS

| JP | 1155966 A | 2/1999 |
| JP | 2000158375 A | 6/2000 |
| RU | 2417877 C1 | 5/2011 |
| WO | 2010048765 A1 | 5/2010 |

OTHER PUBLICATIONS

Chinese Office Action dated Dec. 4, 2018 for corresponding Chinese Patent application No. 201580041470.5.

\* cited by examiner

GRIPPER DEVICE, AND USE OF A GRIPPER DEVICE

BACKGROUND OF THE INVENTION

The present invention relates to a gripper device, which is designed so as to be movable along a movement path, and to serve the purpose of grasping and holding a workpiece, and of moving the workpiece along the movement path, in accordance with the preamble of the main claim. The present invention also relates to the utilisation of such a gripper device.

Generic gripper devices are generally of known art in the technical fields of robotics, factory automation and material handling. With the purpose of gripping a wide variety of workpieces for movement purposes at a first position on a movement path, and then passing them on to a different second position of the movement path, generic gripper devices are typically implemented as operative elements in terms of arms or jaws designed for gripping purposes, which, in reaction to a (typically pneumatic or electromagnetic) drive enter into an operative pairing with the workpiece (effecting, for example a force fit and/or form fit with the workpiece) and then by virtue of movement of the gripper device also enable the (accompanying) movement of the workpiece.

Depending upon the purpose of movement, that is to say, of conveying, and the type, contour, or surface configuration of the workpiece, one of the gripping principles of known art is of advantage, wherein, in addition to the properties of the workpiece other constraints play a role, such as cycle times (for the gripping action, and/or the transportation movement), numbers of cycles, that is to say, the service lives that must be guaranteed, or other environmental conditions (and also, for example, the stresses caused by moisture, cold, or dust).

It is also of known art to require, in principle, the use from the prior art of an actuator system for generic gripping purposes implemented in terms of a magnetic shapememory alloy material (also referred to as MSM=magnetic shapememory); in another manner of known art, an actuator is employed for the purpose of gripping the workpiece, which can expand in response to the energising of a coil, in particular a coil appropriately surrounding an actuator crystal, wherein, compared with gripper systems implemented in terms of pneumatics or electric motors for example, the MSM material shows advantages, for example, in terms of reaction times, and the speed of the drive movement.

For all generic actuator means and associated drive and actuation principles of presupposed known art it is nevertheless a common factor that the actuator means must be provided with complex peripheral units together with supply lines; thus these are, for example, the fluid (pressure) supply lines of pneumatic systems, and the electrical supply cables, together with the coils that have been cited, in the case of systems based on electric motors and MSM materials. However, such additional infrastructures of lines and cables are subject to loads promoting high wear, in particular in cases of high accelerations, large numbers of movement cycles, and/or in cases of systems deployed in stressful environments, which loads often limit the effective service lives of systems that are implemented in this manner, and/or determine maintenance and overhaul cycles, with corresponding expenditure of time and costs, which result in a need for improvement, in particular in industrial conveyor systems, logistics and production environments.

Moreover the generic provision of the infrastructure of lines, cables and drives as described on gripper devices of known art causes moving components, such as, for example, the arms or jaws forming the first and second contact sections, to be additionally loaded by the masses that are being moved, with the result that the dynamic behaviour of the gripper device is impaired. Thus, for example, the potential (switching) speed advantages of a magnetic MSM actuator are thereby in part in turn negatively affected by the fact that in the context of the overall system the coil means required for the application of a magnetic field onto the MSM crystal, together with the supply lines, increase the mechanical inertia of the overall system. The same is true for electromotive or pneumatic actuator means, whose ability to move (and to accelerate) is impaired or limited in the same manner by the infrastructure of supply lines and cables as discussed.

SUMMARY OF THE INVENTION

The object of the present invention is therefore to create a gripper device in accordance with the present disclosure, which is improved both with regard to the simplicity of the movable design of gripper device and also with regard to its dynamics, in particular by reduction of the mass that is moved and reduction of the influence of an infrastructure of supply lines and/or cables on the actuator means. Here in particular a movable design of gripper device is to be created that is suitable for the industrial conveying and transportation of workpieces, which is improved with regard to the workpiece speeds and accelerations that can be achieved, in particular by the reduction of cycle times, at the same time demonstrates less wear and as a result longer service lives, and in general terms enables the deployment of a gripper system that is operationally more reliable, low in maintenance and with a design that can easily be implemented.

The object is achieved by the gripper device with the features disclosed herein. Advantageous further developments of the invention are also described herein. Within the framework of the invention independent protection is moreover claimed for a gripper system utilising such an inventive gripper device, which in particular can advantageously be employed in industrial production and conveyor systems technology.

In an inventively advantageous manner the actuator means applying the drive force onto the first contact section and thus driving the latter for the operative pairing are composed of the magnetic shape-memory alloy material with magnetic field generating means, which are mounted external to the gripper device, that is to say, they are not mechanically connected with a gripper body forming the contact sections on appropriate jaws or arms, but rather are provided separately from the said gripper body, and are preferably static. At the same time the possibility that the gripper device itself can also have (additional) magnetic field generating means, for example on the gripper body, is not ruled out. The significant advantage of the invention, and as a preferred form of embodiment to implement in this respect, consists however in the fact that for purposes of effecting the application of the magnetic field onto the (gripper-side) actuator means, the inventively provided magnetic field generating means are provided in isolation from the gripper body, and, in an again preferred manner, are assigned to a fixed position on the movement path, at which the interaction is then enabled. In other words, the said inventive measure of a static, externally mounted magnetic field generating means allows the magnetic interaction for the application of a magnetic field to the actuator means, if the gripper device is at or adjacent to the position at which the magnetic field generating means are formed and provided, such that at this position an expansion or compression of the magnetic shape-memory alloy material induced by the magnetic field may take place with the purpose of producing (or detaching) the operative pairing with the workpiece. However, as a result of the inventive statically configured (or possibly also movable in another mechanically independent manner) provision of the magnetic field generating means with respect to the gripper device and the actuator means, the magnetic interaction takes place only at the corresponding position of the magnetic field means. No such magnetic interaction takes place at other positions along the movement path, but this is not necessary, in particular if the desired gripping or releasing of the workpiece is implemented by the magnetic interaction at the static position of the magnetic field generating means, and any further movement operations (and positions) along the movement path then only have to allow the workpiece to be held on the gripper device, and no application of magnetic field is necessary within the scope of the invention. In a further development another (second) position of the movement path with (additional) magnetic field generating means provided would then, for example as a target destination, allow a (renewed) magnetic interaction with the actuator means so as to release, that is to say, to deliver a workpiece (that was previously held).

The obvious advantage of this inventive measure lies firstly in the fact that the magnetic field generating means for the magnetic interaction with the actuator means, that is to say, for the application of a magnetic field to the latter, do not contribute to the moved mass (since they are no longer moved parts of the gripper device); they do not have to be accelerated, and thus significantly improve the mechanical dynamic properties of the device. In addition, the structure of a gripper body implementing the gripper device is significantly simplified, since the latter, in its simplest form, must only implement the contact sections, and accommodate or anchor the actuator means acting on the first contact section with the drive force appropriately; in contrast, for example, electromagnetic coil means, together with electrical supply cables, additionally or alternatively permanent magnetic means (potentially heavy and brittle, and therefore vulnerable to impact) are also provided as typical magnetic field generating means; these are static and therefore immovable, and are accordingly no longer subject to significant wear phenomena, and, as described, do not impair the dynamic properties of the system.

Within the scope of possible implementations of the invention, the inventive operative pairing is to be understood in broad and comprehensive terms; it is to include both a clamping action, a frictional action, or similar lateral engagement of the first and/or second contact sections with an appropriate (external) surface of the workpiece (which can assume almost any configuration), and also an accompaniment action (enabling a form fit), an engagement or interlock in appropriate grooves, undercuts, projections or similar engagement sections of the workpiece, wherein the first and/or second contact section can then be appropriately contoured or configured in accordance with a desired action in the course of the gripping or holding process.

It is also within the scope of a preferred development of the invention to implement the contact sections by means of a gripper acting in a pincer-like manner, and it is further preferred to provide gripping jaws and/or gripping arms for purposes of gripping and/or holding the workpiece; this configuration, while it is indeed preferred, is not to be understood as restrictive. However, in a further preferred configuration, with a flat gripper body formed, for example, from a metallic and/or plastic material, an implementation of the invention is enabled that combines ease of manufacture and high continuous load-bearing ability with insensitivity to disturbances and low production costs. Here a single-piece design is conceivable (for example, in the form of a yoke implemented in terms of injection moulding of the plastic material, with arms to form the contact sections, wherein an MSM body is appropriately positioned as the actuator means between the elastically movable arms), alternatively a design with one or more hinged or articulated sections between components of a multi-part gripper body would also be conceivable, wherein these sections then in turn connect the mechanical components implementing the contact sections at a suitable location for purposes of producing and applying the drive force. Depending on the material to be employed in the implementation of the gripper body and its suitability for deformation (for example in the case of a gripper that is to be implemented in one piece), or for a multipart design, the person skilled in the art will select the appropriate design and configuration according to the particular manipulation requirement, wherein implementation of the inventive actuator by means of an elongated (single- or multi-part) body for purposes of a magnetic field-induced expansion or contraction in the direction of extension is also a preferred variant, although the invention is not restricted to such forms of embodiment.

In the practical implementation of the invention and in accordance with further developments, it has been found to be preferable to assign reset means and/or spring means to the actuator means, in particular on or in the gripper; in terms of their force behaviour these means are superimposed onto the force of the actuator means; in the simplest case, for example, a spring can be mechanically tensioned in parallel with an MSM body between the arms or jaws implementing the contact sections of the gripper device. The said spring means can then be appropriately dimensioned and set up to enable the holding of the workpiece even after the application of the magnetic field to the actuator means has terminated (that is to say, after an electrical deactivation of an electromagnet, or after a spatial movement of the gripper device from a magnetically active engagement with the static magnetic field generating means provided). If the application of the magnetic field is terminated, for example after a magnetic field-induced expansion of a body, the body remains in the expanded position, but a (continued) application of force to a workpiece sitting on a driven contact section is, as a general rule, no longer possible. Here, for example, a (permanent) spring force of a tension or compression spring, appropriately introduced previously, would then act, and would thus promote the inventive holding of the workpiece within the scope of the system.

In the concrete configuration of the said reset means or spring means in accordance with further developments (wherein, instead of a—mechanical—spring, for example, it is also possible to employ e.g. oppositely directed shape-memory alloy materials to which a magnetic field can be applied), in a further development provision is firstly and advantageously made to set up the reset or spring forces of the said reset or spring means such that they enable a compression (reset) of an MSM body expanded by magnetic field action in the state in which no field is applied. In this case, however, the application of the magnetic field always has to overcome the said reset (spring) in the course of an expansion of the actuator means; however, an MSM body arrangement can advantageously be implemented in which application of the magnetic field only takes place one-dimensionally and perpendicularly to an expansion direction (and thus typically a longitudinal direction or extension direction of an elongated design of actuator crystal). Since, in addition to the spring properties, the magnetomechanical properties of the MSM body are also relevant in the design and conception, the so-called twinning stress, that is to say, the mechanical force required for a reset without a magnetic field, would be appropriately configured in this variant by the choice of material and matched to the spring force.

The same applies for an alternative procedure with the implementation of associated reset means or spring means to the actuator means. If these are set up such that the gripper therewith provided remains in its activated position after the application of the magnetic field (and is not reset by the reset means or spring means, for example because the latter have a weaker spring force compared with the twinning stress), a potentially high gripping force on or onto the workpiece ensues with a correspondingly high designed or set up value of twinning stress. A reset (or closure) of this configuration would then preferably take place by the application of a magnetic field in a direction orthogonal to the direction of the first magnetic field; this can be provided by appropriate configuring and/or positioning of magnetic field generating means, for example at a second position along the movement path, enabling a release and/or delivery. The advantage of this variant is that a gripper device implemented in this manner does not first have to be opened and/or moved from an initial position (in this respect monostable), which in turn can provide potential speed advantages. However, since the gripping force is essentially determined by the twinning stress of the material, it is potentially lower than in the case of the variant first discussed.

In all cases, an advantageous implementation of the actuator means is carried out in terms of one or more MSM bodies, which as a general rule are produced as a monocrystalline material based on NiMnGa (with further doping as required), and as such can also be presupposed to be generally of known art for actuator purposes.

The magnetic field to be used within the context of the invention for the application of the magnetic field to the actuator means can, in accordance with a further development of the invention, be generated in terms of permanent magnets or electromagnets (or by a combination of these), wherein any permanent magnets, and also any core and coil means of an electromagnetic variant in accordance with the invention can be provided separated from and mounted external to the gripper device, and preferably statically at at least one fixed, immovable position along the movement path, in accordance with the particular purpose for the action onto the actuator means at this position.

In particular, when electromagnetic magnetic field generating means are employed, the efficiency of the system can be recognised by the fact that an activation of the coil means of such electromagnets (consuming electrical power to the extent required) is only required if a magnetic field is used for purposes of the application of a magnetic field during the magnetic interaction with the actuator means; it becomes clear that during all movement and conveying steps along the movement path outside the station(s) for purposes of gripping or releasing the workpiece, the workpiece is held without the consumption of any energy.

The result is that the present invention allows, in a surprisingly simple and elegant manner, the further development of gripping, transporting and conveyor systems of known art (to be implemented by means of MSM actuator means), wherein, however, the inventive externalisation (relocation) of the magnetic field application for the actuator means to a static position, removed from the actual moving gripper device, achieves significant advantages both in terms of the movement and acceleration capability of the said gripper device, and significantly reduces the risk of wear, disturbances, and other malfunctions.

BRIEF DESCRIPTION OF THE DRAWINGS

Further advantages, features, and details of the invention ensue from the following description of preferred examples of embodiment, and also from the figures; in the latter.

DETAILED DESCRIPTION

Figure 1:
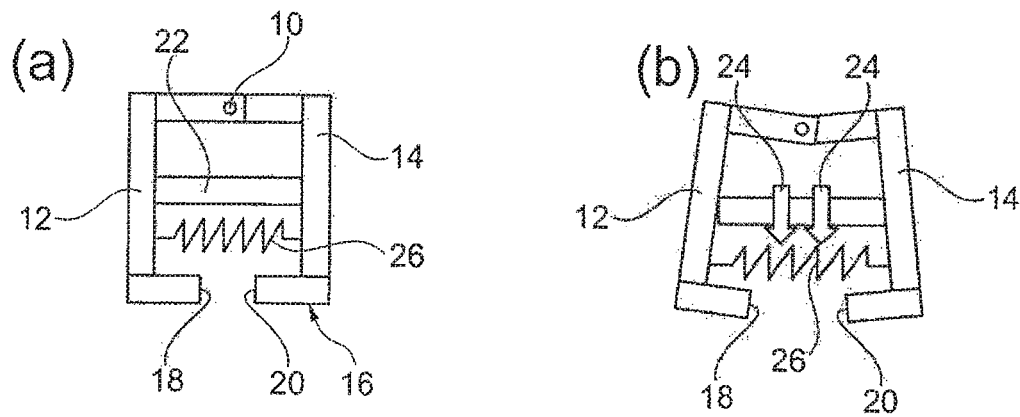
FIG. 1 shows in a schematic view the principles of a gripper device in accordance with a first example of the invention in the gripping state (subfigure (a)) and in the open state (b)
Figure 2:
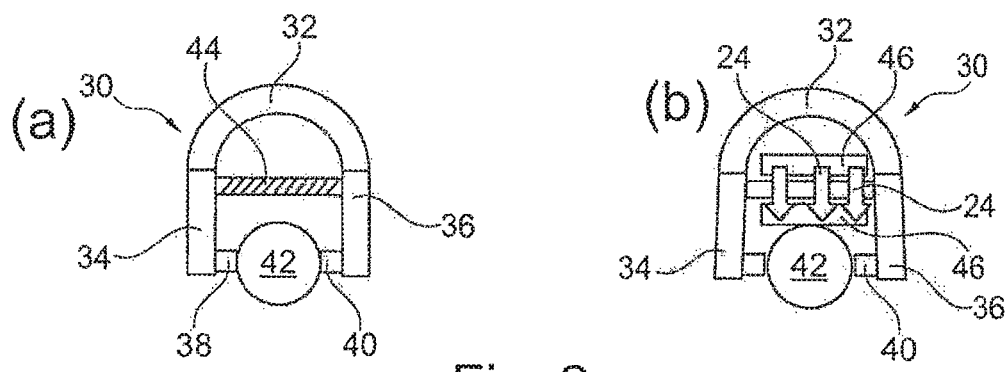
FIG. 2 shows schematic views in analogous subfigures of a second example of embodiment of the gripper device.

Possible basic configurations of the present invention (not exhaustive with regard to the breadth of variants) are explained with the aid of FIGS. 1 and 2. Thus, a gripper device schematically shown in the first example of embodiment of FIG. 1 has a gripper 16 formed by two gripping arms 12, 14, which are connected to one another such that they can pivot about a joint 10, and which by means of a pair of jaw sections 18 and 20 formed on the free ends of the arms 12, 14 have contact sections for purposes of interaction with a workpiece (not shown in FIG. 1).

An MSM crystal body 22, which is designed in the elongated manner as shown from an NiMnGa alloy exhibiting a magnetic shape-memory behaviour, connects the arms 12, 14 such that a magnetic field (arrows 24 in FIG. 1(*b*)) that is introduced transversely to the direction of extension of the actuator element 22 effects an expansion of the MSM crystal along the direction of extension. In the manner shown, this variation in length spreads the pair of arms 12, 14 apart such that in subfigure 1(*b*) the gripper is opened for purposes of receiving a workpiece on the jaws, or more particularly, on the contact sections 18, 20 formed on the latter. Moreover, as can be discerned in FIG. 1, the expansion of the crystal body 22 operates against a reset force of a tension spring 26 (shown schematically) and mechanically parallel to the MSM crystal body 22 with the arms 12, 14, which is set up with regard to its force behaviour such that the MSM actuator 22 is returned to its contracted initial position (FIG. 1(*a*)) when the magnetic flux, shown schematically by the arrows 24 in FIG. 1(*b*), is terminated. In addition, the spring 26 ensures that, when the workpiece, as the material that is to be transported, is held between the jaws 18, 20, for example in the spread apart position of FIG. 1(b), the spring provides a compression and holding force, even when the magnetic flux 24 is terminated; the MSM material itself no longer generates any kind of force.

A second example of embodiment for purposes of implementing the gripper device, within the scope of the present invention, is illustrated by FIG. 2, once again with the subfigures (a) and (b). Here a gripper body 30 is firstly integrally formed from a plastic material with a yoke section, that is to say, a curved section 32, and arm sections 34, 36 seated on the latter; in the region of the free ends of the arm sections 34, 36, jaw sections 38, 40 are again formed as contact sections for purposes of interaction with a workpiece 42 (here shown to be cylindrical in the plan view). An MSM crystal body 44 of elongated design is configured as an actuator means such that an expansion takes place in a longitudinal direction or direction of elongation in reaction to a magnetic flux (orthogonal to the longitudinal direction, once again illustrated by arrows 24 in subfigure (b)); subfigure 2(b) illustrates a widening of the pincer-like gripper body 30 achieved in response to the application of the magnetic field, and thus an expansion of the body 44, with the result that the jaw sections 38, 40 detach themselves from the workpiece 42, and release the latter accordingly.

It is important that the magnetic field generating means 46 schematically shown for producing the magnetic field 24 (FIG. 2(b), wherein the magnetic field generating means 46 would analogously generate the magnetic flux 24 through the actuator module 22, as in FIG. 1(b), for example) are not part of the gripper device shown in FIG. 1 or FIG. 2, that is to say, they are in no way mechanically connected to the grippers 16 or 30, so that they are not movable with the latter, and are not moved with the latter.

Rather, the representation shown below as a further form of embodiment and in the context of a gripper system designed with the inventive gripper device, together with the sequence of movement steps along the movement path, illustrates the inventive functionality of the externally mounted magnetic field application, namely by means of the static magnetic field generating means that are here provided.

Figure 3:
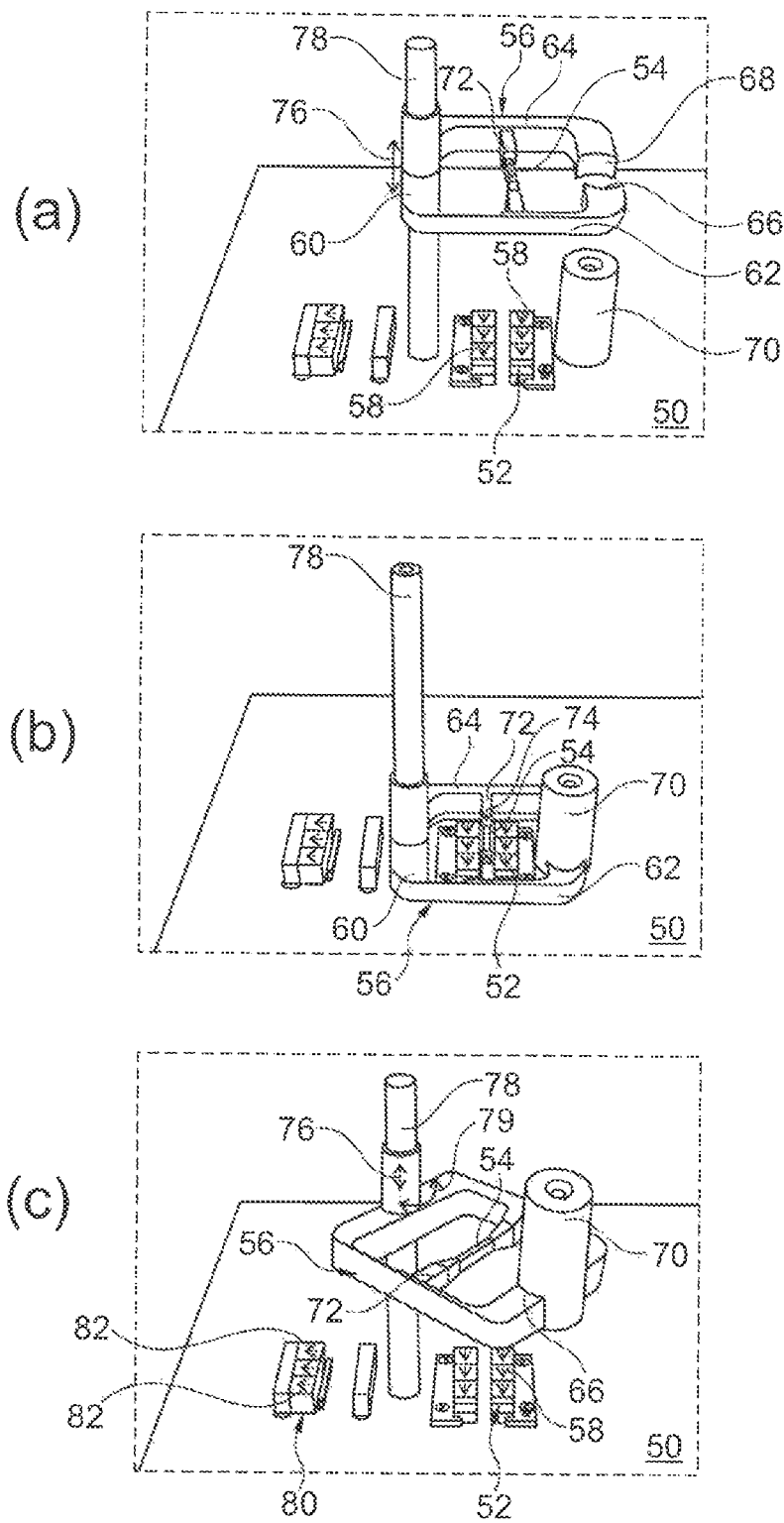
FIG. 3 shows, in a sequence of subfigures (a) to (c), views of a gripper system implemented with the gripper device of the example of embodiment of FIG. 2 in various movement and transportation stages.

In concrete terms, FIG. 3 illustrates how magnetic field generating means 52 in the form of a permanent magnet 52, which is designed as an actuating means, so as to interact on both sides with an elongated magnetic MSM-body 54, are statically fixed on a baseplate 50, and are thus mounted at a fixed position independently of the gripper device 56, which is shown in FIG. 3 to be movable. The permanent magnets 52 are configured such that they can introduce a (permanent magnet) magnetic field into the MSM crystal body 54 along a set of arrows 58 shown symbolically, if the latter, in the sub-figure of FIG. 3(b), is located adjacent to the permanent magnets 52, and is thus in immediate magnetically effective engagement with the latter.

In the example of embodiment shown in FIG. 3, the gripper 56 is configured as an integrally formed yoke or frame element (with a crystal body 54 inserted), wherein arms 62, 64, which are connected to one another in an articulated manner on a yoke section 60, at their respective free ends form a first contact section 66 and a second contact section 68, which are shaped for purposes of gripping and holding a workpiece 70, here in the form of a cylindrical body as the material that is to be transported. The crystal body 54, which is attached to the arms 62, 64 via web sections 72, is selected and configured as an actuator such that a contraction, that is to say, a shortening of length along the direction of extension of the crystal, takes place in reaction to the application of a magnetic field, as illustrated by the associated arrows 74 in subfigure (b). Correspondingly, this contraction leads to a closing of the pincer-like gripper, with the effect that the contact sections 66, 68 are moved towards one another so as to grip and hold the material that is to be transported 70, and in a contracted operating position of the crystal 54, as conditioned by the twinning stress in the crystal, hold the workpiece 70.

In the example of embodiment shown, the gripper 56 is mounted such that it can be moved both up and down along the arrow directions 76, and can also be pivoted horizontally about the associated guide axis 78, that is to say, parallel to the plane of the baseplate 50.

The sequence of subfigures (a) to (c) of FIG. 3 illustrates a corresponding movement operation: In the widened manner shown in (a), the gripper 56 travels downwards along the guide 78, and, as can be discerned in subfigure (b), firstly surrounds the surface of the workpiece 70, which is to be gripped and then transported or moved. During the downward movement of the gripper 56 in the direction of the underlying plane baseplate 50, the actuator 54 moves between the pair of static or stationary permanent magnetic strips 52 fixed securely to the baseplate 50, such that a permanent magnetic field of the said magnetic field generating means interacts magnetically with the crystal 54, such that the contraction illustrated schematically by the arrows 74 takes place. The arms 62, 64, which are moved towards one another in accordance with this drive force, with the contact sections 66, 68 that are provided on the end faces of the arms and are directed towards the workpiece, grip onto the surface of the workpiece 70 and there generate an static frictional force, that is to say, a holding force. Subsequent lifting once again of the gripper device 56 in the upwards direction of the arrow 76, combined with pivoting in the direction of the arrow 78, then causes the workpiece 70, which is held between the jaw end sections 66, 68, to be carried with the jaws, and, in accordance with the intended movement and transportation purpose, the workpiece 70 can be placed in an intended release position, that is to say, delivery position. In the example of embodiment of FIG. 3, the additional static magnetic field generating means 80, in the form of a further arrangement of permanent magnets, are provided in the left-hand region on the baseplate 50. Specifically, in the further course of the pivoting movement along the direction of the arrow 78 and a subsequent (renewed) lowering of the gripper 56 in the direction towards the baseplate 50, the crystal 54 would then enter into engagement with the further permanent magnets. These, as symbolised by the set of arrows 82, have a magnetization such that, contrary to the longitudinal flow through the crystal caused by the permanent magnets 52, a transverse flow takes place through the crystal, which, in the example of embodiment shown, causes an expansion of the MSM crystal material and therefore the arms 62, 64 to be driven apart, together with the end face contact sections 66, 68. These then detach themselves from the load that is being moved 70, such that the latter would then be deposited in the intended manner.

Figure 4:
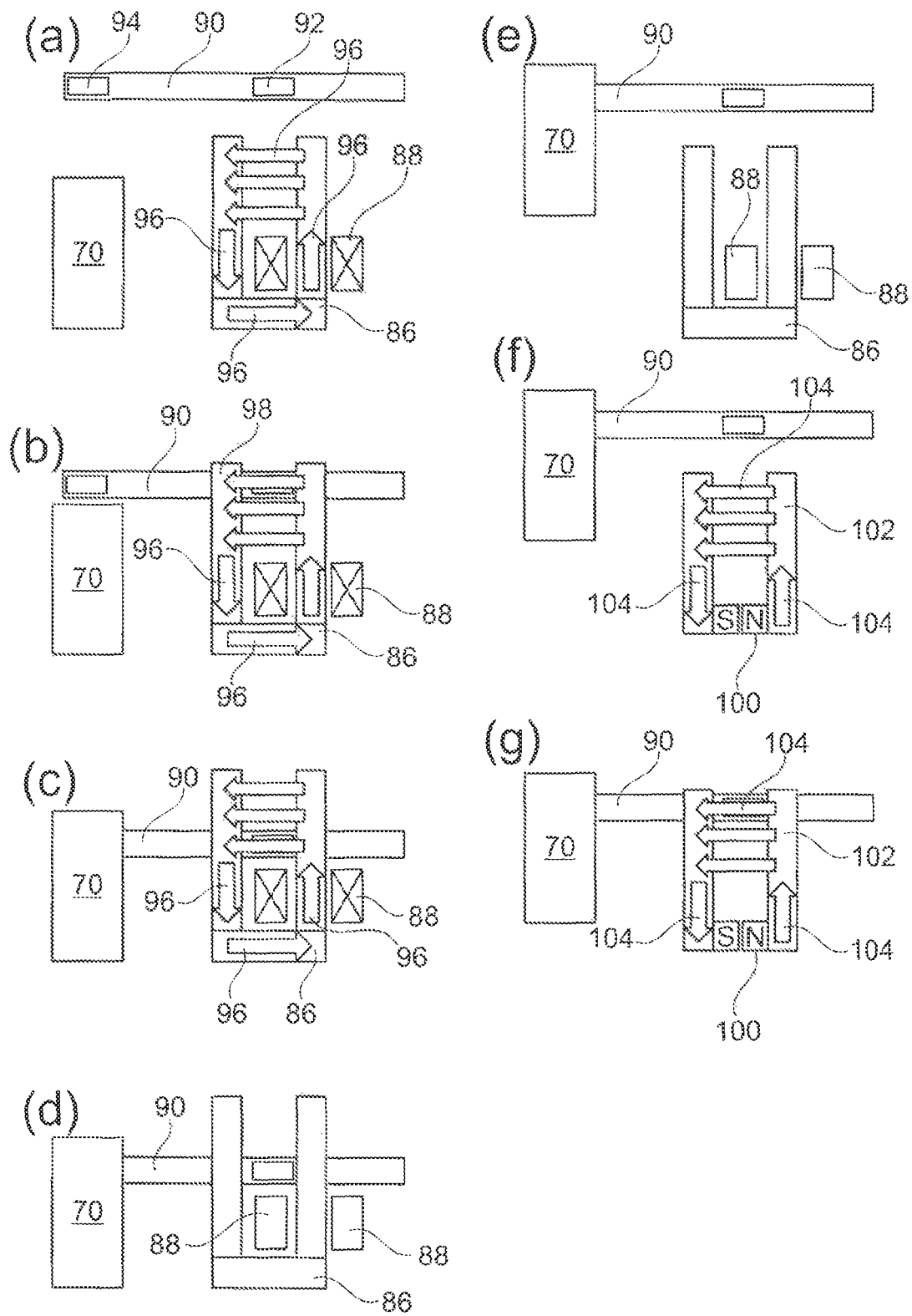
FIG. 4 shows in subfigures (a) to (e) schematic longitudinal section views illustrating a mode of operation of a further form of embodiment of the invention with electromagnetic magnetic field application, together with, in subfigures (f) and (g), a permanent magnet magnetic field application.

In the schematic representations of FIG. 4 these processes are additionally illustrated with regard to the magnetic flux conditions, wherein the subfigures (a) to (e) of FIG. 4, as an alternative to the design of the magnetic field generating means 52 in FIG. 3 in terms of permanent magnets, show in FIG. 4 an electromagnetic device, which forms a core structure 86, shown in the form of a yoke in the longitudinal section view, which by means of coil means 88, which can be energised by an appropriate control current, is provided with an associated magnetic field. The reference numeral 90 in FIG. 4 illustrates a gripper unit, somewhat analogous to FIG. 1, 2 or 3, with an MSM crystal body 92 schematically shown in a side view (extending longitudinally in this respect at right angles to the plane of FIG. 4) and with contact sections 94 for an appropriate holding interaction with the workpiece 70, (e.g. once again cylindrically configured), as the material that is to be gripped and transported.

The functionality of the technology represented in FIGS. 4 (*a*) to (*e*) is as follows: In the case of a gripper 90 to be moved (in the plane of the figure downwards) onto the static magnetic field generating means in this case formed by core structure 86, and coil 88, the coil 88 is energised such that an electromagnetic field is generated in accordance with the set of arrows 96. As illustrated in subfigure (b), as soon as the gripper 90 reaches the upper arm 98 of the electromagnet core structure 86, the electromagnetically generated field 96 flows through the MSM body, and the gripper 90 (acting in the manner of forks or pincers) closes, wherein the schematically shown contact sections 94 are moved in the direction towards the surface of the workpiece 70 for purposes of gripping the latter.

Subfigure (c) of FIG. 4 illustrates this operating state; while the electromagnetic field 96 of the coil 88 is still activated, the gripper 90 reaches its lowest position; the body 70 is already held on the end face contact region 94 of the gripper.

Before a further raising of the gripper 90 and carrying of the workpiece 70 takes place, a deactivation of the applied magnetic field 96 is effected by a deactivation of the coil current through the coil unit 88, as shown in subfigure (d). However, by virtue of the twinning stress of the crystal body 92, the contact sections 94 continue to hold the body 70, so that the latter—while the application of the magnetic field continues to be deactivated—in subfigure (e) can be raised and carried along the movement path for purposes of onward transportation.

The subfigures (f) and (g) illustrate, in the form of a schematically shown permanent magnet arrangement 100 with core sections 102 guiding a permanent magnetic flux 104, how the magnetic field generating means can be configured alternatively; in this respect developing further the example of embodiment of the subfigures (a) to (e), the permanent magnet magnetic field generating means can in this respect also be positioned at a second position (here, for example, for purposes of releasing the load 70 from the gripper 90), wherein in the transition from subfigure (f) to (g) the flux 104 in interaction with the crystal 92 can be designed such that, for example, in the operating state (g) as a result of expansion the crystal body 92 the holding state is then revoked and the workpiece 70 can thus be disengaged, that is to say, released.

The present invention is not restricted to the gripper device and gripping principles as described, configured and acting in the manner of a yoke and pincers, rather these are to be understood as purely exemplary and are to be configured in a suitable manner for each particular case of deployment.

Figure 5:
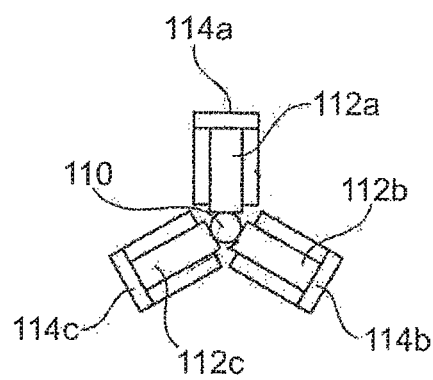
FIG. 5 shows a schematic of the principles of a further example of embodiment with a gripper having three actuators.

Thus FIG. 5, for example, illustrates a further example of embodiment of the invention as a multiple gripper, in which, supported centrally from an abutment 110, a gripper with three actuator modules, in each case in the form of elongated MSM crystal rods 112*a*, 112*b* and 112*c*, in reaction to a (particular) magnetic field application can engage via end face contact sections 114*a* to 114*c* with a workpiece (which is, for example, to be gripped on an unobstructed inner surface). Here, too, it is at the discretion of the required configuration to select suitable means for the magnetic field generation and, if appropriate, to design a reset or repositioning function (in the form of springs that are to be provided appropriately).

Figure 6:
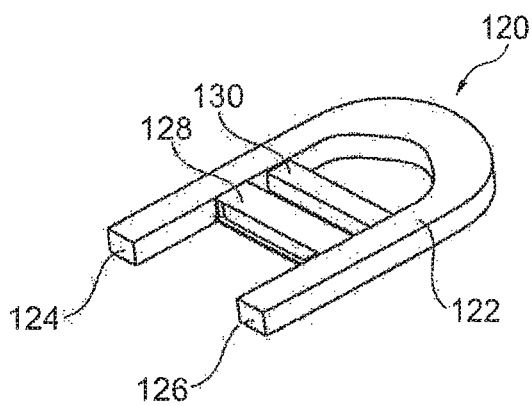
FIG. 6 shows a further example of embodiment of the invention with two MSM actuator modules enabling opening and closing of the gripper as shown.

In turn a further variant of the invention is shown schematically with the gripper 120 of FIG. 6. The yokeshaped body 122, which is formed from a plastic material, for example, can be designed or configured with free end sections 124, 126, for example in the manner described above, for purposes of gripping a workpiece. A second MSM crystal body 130 is assigned in parallel to an MSM crystal body 128, which is employed so as to push the arms apart or to bring them together, such that the actuator module 130 (with an appropriate magnetic flux) can act in a repositioning manner on an expansion or contraction of the MSM crystal body 128, or vice versa.

It is thus clear that the gripping or driving, holding and movement principles of the gripper device can also be configured in any manner within the scope of the present invention and are not limited to the illustrated exemplary embodiments. In addition to external gripping principles, internal gripping principles, as, for example, in the example of embodiment in FIG. 5, can also be implemented on or in a workpiece. In addition to one-piece grippers (usually with bodies providing elastic deformation of material, as in FIG. 2), one or a plurality of articulations (FIG. 1) can be provided, wherein for the selection of such principles it is not least the choice of materials that plays a role; in addition to the plastic bodies referred to, which, for example, can be simply produced by, for example, injection moulding or similar processes suitable for mass production, metal gripper designs are also particularly suitable, wherein it is again common to all forms of implementation, not least by virtue of the inventive mounting of the magnetic field generation in static regions external to the gripper device, that the actual moving gripper device can easily be cleaned, is insensitive to disturbances, and in particular can also be beneficially employed to meet clean room and/or hygiene requirements.

The invention claimed is:

1. A gripper device (16; 30; 56; 90; 120) which is designed so as to be movable along a movement path, and which serves for gripping and holding a workpiece (70) and for moving the workpiece along the movement path, with at least one first contact section (18; 38; 66) which, to produce an operative pairing with the workpiece that effects the gripping or holding action, can be driven relative to a second contact section (20; 40; 68), which first contact section is assigned actuator means (22; 44; 54; 128), which are designed to exert a drive force in reaction to the application of a magnetic field, and which are composed of a magnetic shape-memory alloy material, wherein the actuator means for magnetic interaction are formed, for the application of a magnetic field, with magnetic field generating means that are stationary at one position of the movement path (52; 80; 86; 88), or with magnetic field generating means that are movable independently of the gripper device, wherein the gripper device is moveable along the movement path relative to the magnetic field generating means such that the actuator means can be moved into and out of a magnetic field generated by the magnetic field generating means.

2. The device in accordance with claim 1, wherein the at least one first and the at least one second contact section implement a gripper, designed for purposes of an interaction with the workpiece, wherein the first or second contact section is designed on gripping jaws or gripping arms (12; 14; 34; 36; 62; 64) of the gripper.

3. The device in accordance with claim 2, wherein the gripper provides for the rotation, twisting, deformation, pivoting or relative displacement of body sections implementing the first or second contact section of a gripper body implemented in one or more parts in reaction to the drive force of the actuator means.

4. The device in accordance with claim 2, wherein the gripper is designed in at least some sections from a plastic or a metal material, on which the actuator means are seated, or in which the actuator means are integrated.

5. The device in accordance with claim 1, wherein the operative pairing of the first or second contact sections on the workpiece implements a clamping action, an engagement action, an accompanying action, a locking action, and/or a frictional action.

6. The device in accordance with claim 1, wherein the actuator means, of an elongated design, is designed and set up such that it can be expanded or compressed in reaction to the application of the magnetic field in the expansion direction.

7. The device in accordance with claim 1, wherein the actuator means are designed and set up for purposes of interaction with reset means or spring means (26; 130), such that a reset force or spring force of the reset or spring means can effect or promote the capture and holding action in a operating state of the actuator means in which a magnetic field is not applied.

8. The device in accordance with claim 7, wherein the reset means or spring means are designed and set up for purposes of interacting with the actuator means, such that the reset force or spring force effects a return of the actuator means into an initial position of the magnetic shape-memory alloy material in the operating state in which no magnetic field is applied.

9. The device in accordance with claim 7, wherein the reset means or spring means are designed and set up for purposes of interacting with the actuator means, such that the actuator means, also remain in a position achieved by the application of the magnetic field, in the operating state in which no magnetic field is applied, and an additional application of a magnetic field, effects a return of the actuator means into an initial position before the application of a magnetic field.

10. The device in accordance claim 1, wherein the stationary magnetic field generating means provided at a first position of the movement path are designed and arranged such that a gripper implementing the first and the second contact sections, having the actuator means, and movable along the movement path, only enables the magnetic interaction at the first position.

11. The device in accordance with claim 10, further comprising additional stationary magnetic field generating means (80), provided at a second position of the movement path that is spaced apart from the first position, which are designed and set up for purposes of magnetic interaction with the actuator means, such that at the second position a mechanical process of manipulation of the workpiece can be effected.

12. The device in accordance with claim 1, wherein the magnetic field generating means have a permanent magnet or an electromagnet having coil means that can be electrically activated.

13. The device in accordance with claim 12, wherein the coil means of the electromagnet are designed such that they are connected or activated such that they can be energised temporarily, only at a time at which the actuator means are located at a position provided for magnetic interaction with the magnetic field generating means, or at a position adjacent to this position.

14. The use of the gripper device in accordance with claim 1 for purposes of implementing a gripper system in industrial production engineering or conveyor systems engineering.

* * * * *